United States Patent [19]

Crivello

[11] 4,102,687

[45] * Jul. 25, 1978

[54] UV CURABLE COMPOSITION OF A THERMOSETTING CONDENSATION RESIN AND GROUP VIA ONIUM SALT

[75] Inventor: James V. Crivello, Clifton Park, N.Y.

[73] Assignee: General Electric Company, Schenectady, N.Y.

[*] Notice: The portion of the term of this patent subsequent to Nov. 11, 1994, has been disclaimed.

[21] Appl. No.: 768,074

[22] Filed: Feb. 14, 1977

[51] Int. Cl.$^2$ .................. G03C 1/68; G03C 5/00; G08F 2/46; G08F 4/00
[52] U.S. Cl. ..................... 96/115 R; 96/35.1; 204/159.18; 204/159.21; 204/159.24; 427/54
[58] Field of Search ............ 96/115 P, 115 R, 35.1; 427/54; 204/159.24, 159.23, 159.18, 159.21

[56] References Cited

U.S. PATENT DOCUMENTS

| T861,022 | 4/1969 | Philpot et al. | 96/115 R |
|---|---|---|---|
| 3,691,133 | 9/1972 | Sura | 269/2 EC |
| 3,843,603 | 10/1974 | Gates | 96/115 R |
| 3,868,254 | 2/1975 | Wemmers | 96/115 R |
| 3,929,488 | 12/1975 | Smith | 96/115 R |

OTHER PUBLICATIONS

Knapczyk et al., J. Org. Chem. vol. 35, No. 8, 1970, pp. 2539–2543.

*Primary Examiner*—Jack P. Brammer
*Attorney, Agent, or Firm*—William A. Teoli; Joseph T. Cohen; Charles T. Watts

[57] ABSTRACT

UV curable coating compositions are provided based on the use of a Group VIa onium salt photoinitiator in combination with an organic resin, such as an alkoxylated melamine, or ureaformaldehyde or phenolformaldehyde resin. The coating compositions can be applied to a variety of substrates and thereafter cured with UV light, followed by a heating step.

7 Claims, No Drawings

UV CURABLE COMPOSITION OF A THERMOSETTING CONDENSATION RESIN AND GROUP VIA ONIUM SALT

The present invention relates to a UV curable thermosetting organic condensation resin and a method for coating various substrates with such UV curable thermosetting organic resin.

Prior to the present invention, phenol-formaldehyde resins and other resins cured with acids, such as urea-formaldehyde and melamine-formaldehyde resins were employed in a variety of coating applications. These thermosetting resins were generally catalyzed with acid, such as phosphoric acid, or p-toluene sulfonic acid. However, once these resins were catalyzed, there pot life was extremely limited. Another problem inherent in such thermosetting organic resins of the prior art is their cure times can be as long as 45 minutes at 150° C, resulting in the loss of considerable lower molecular weight material during the baking period.

The present invention is based on the discovery that thermosetting condensation resins can be made having cure times as little as 5 minutes or less and pot lives of 6 months or more at room temperature by employing an effective amount of a Group VIa onium salt as a photoinitiator. Experience has shown that as little as 5 seconds exposure to ultraviolet light, followed by baking for 15 minutes or less can produce cured films having thicknesses of up to 5 mils exhibiting excellent resistance to the effects of exposure to acetone.

There is provided by the present invention UV curable thermosetting formaldehyde condensation resins comprising (1) a thermosetting organic condensation resin of formaldehyde and a member selected from the class consisting of urea, thiourea, phenol and melamine, (2) an effective amount of a Group VIa onium salt and (3) from 0 to 5 parts of filler per part of said thermosetting organic condensation resin.

The Group VIa onium salts which can be used in the UV curable resin compositions of the present invention are shown in copending application Ser. No. 638,982 of James V. Crivello which was filed on Dec. 9, 1975 and now U.S. Pat. No. 4,058,401, and assigned to the same assignee as the present invention. Included by the Group VIa aromatic onium salts are compounds of the formula,

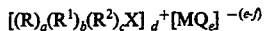

where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, $a$ is a whole number equal to 0 to 3 inclusive, $b$ is a whole number equal to 0 to 2 inclusive, $c$ is a whole number equal to 0 or 1, where the sum of $a + b + c$ is a value equal to 3 or the valence of X, $d = e\text{-}f$ $f$ = valence of M and is an integer equal to from 2 to 7 inclusive $e$ is $>f$ and is an integer having a value up to 8.

Radicals included by R are, for example, $C_{(6\text{-}13)}$ aromatic hydrocarbon radicals such as phenyl, tolyl, naphthyl, anthryl, and such radicals substituted with up to 1 to 4 monovalent radicals such as $C_{(1\text{-}8)}$ alkoxy, $C_{(1\text{-}8)}$ alkyl, nitro, chloro, hydroxy, etc.; arylacyl radicals such as benzyl, phenylacyl, etc.; aromatic heterocyclic radicals such as pyridyl, furfuryl, etc. $R^1$ radicals include $C_{(1\text{-}8)}$ alkyl, such as methyl, ethyl, etc., substituted alkyl such as $-C_2H_4OCH_3$, $-CH_2COOC_2H_5$, $-CH_2COCH_3$, etc. $R^2$ radicals include such structures as:

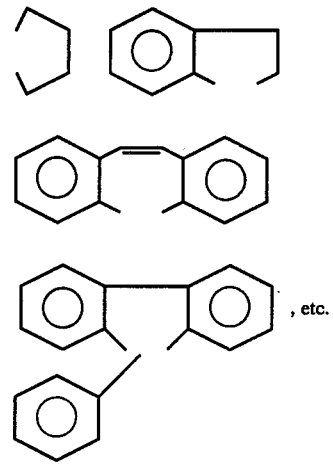

, etc.

Complex anions included by $MQ_e^{-(e\text{-}f)}$ of formula I are, for example, $BF_4^-$, $PF_6^-$, $AsF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, etc., where M is a transition metal such as Sb, Fe, Sn, Bi, Al, Ga, In, Ti, Zr, Sc, V, Cr, Mn, Cs, rare earth elements, such as the lanthanides, for example, Ce, Pr, Nd, etc., actinides, such as Th, Pa, U, Np, etc., and metalloids such as B, P, As, etc.

Group VIa onium salts included by Formula I are, for example,

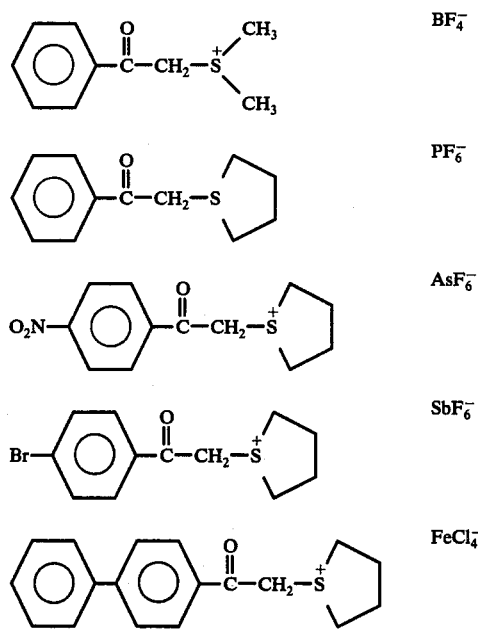

-continued

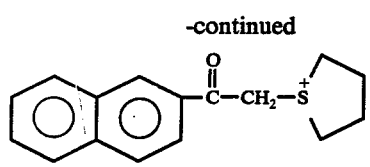  SnCl$_6^-$

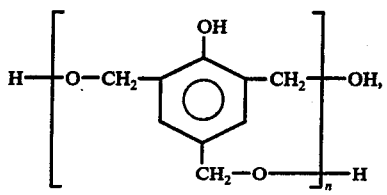

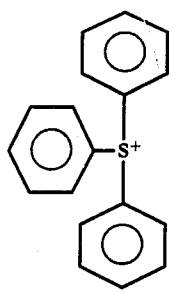  SbCl$_6^-$

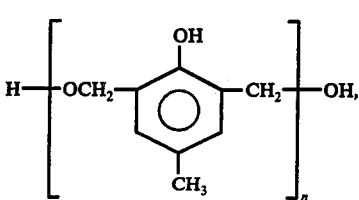

where $x$ and $n$ are integers having a value of 1 or greater than 1;

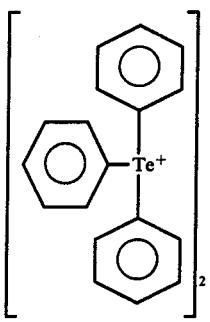  BiCl$_5^-$

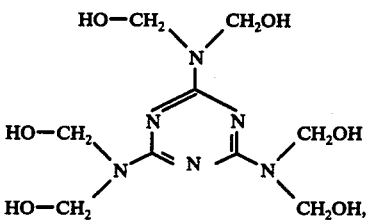

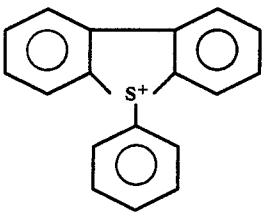  BF$_4^-$

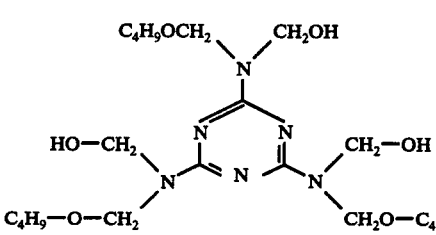

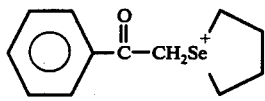  PF$_6^-$, etc.

Some of the Group VIa onium salts of formula I are well known and can be made by the procedure shown in J. W. Knapczyk and W. E. McEwen, J. Am. Chem. Soc., 91 145, (1969); A. L. Maycock and G. A. Berchtold, J. Org. Chem. 35, No. 8, 2532 (1970); H. M. Pitt, U.S. Pat. No. 2,807,648, E. Goethals and P. De Radzetzky, Bul. Soc, Chim. Bleg., 73 546 (1964); H. M. Liecester and F. W. Bergstrom, J. Am. Chem. Soc., 51 3587 (1929), etc.

Included by the thermosetting organic condensation resins of formaldehyde which can be used in the practice of the present invention are, for example, urea type resins, such as

[CH$_2$=N-CONH$_2$]$_x$.H$_2$O,

[CH$_2$=NCONH$_2$]$_x$CH$_3$COOH,

[CH$_2$=NCONHCH$_2$NHCONHCH$_2$OH]$_x$;

phenolformaldehyde type resin, such as

In addition, there can be used melamine thiourea resins, melamine, or urea aldehyde resins, cresol-formaldehyde resins and combinations with other carboxy, hydroxyl, amino and mercapto containing resins, such as polyesters, alkyds and polysulfides.

The UV curable resin compositions of the present invention can be made by blending the thermosetting organic condensation resin as previously defined with an effective amount of the Group VIa onium salts or "onium salt". Effective results can be achieved if a proportion of from .1% to 15% by weight of onium salt is employed, based on the weight of UV curable resin composition. Resulting curable composition can be in the form of a liquid having a viscosity of from 500 centipoises to 100,000 centipoises at 25° C or a free flowing powder can be applied to a variety of substrates by conventional means and cured to the tack-free state within 1 second or less to 10 minutes or more.

Depending upon the compatibility of the onium salt with the organic resin, onium salt can be dissolved or dispersed in the organic resin along with an organic solvent, such as nitro methane, acetonitrile, etc., prior to its incorporation. In instances where the organic resin is a solid, incorporation of the onium salt can be achieved by dry milling, or by melt mixing the resin, whereby the onium salt is incorporated.

It has been found that the onium salt also can be generated in situ in the presence of the thermosetting organic resin if desired. The curable compositions may contain inactive ingredients, such as inorganic fillers, dyes, pigments, extenders, viscosity control agents, process aids, UV screens, etc., in amounts of up to 5 parts of filler, per part of organic condensation resins. The UV curable compositions can be applied to such substrates as metal, rubber, plastic, molded parts of films, paper, wood, glass cloth, concrete, ceramic etc.

Some of the applications in which the curable compositions of the present invention can be used are, for example, protective, decorative and insulating coatings, potting compounds, printing inks, sealants, adhesives, impregnated tapes, photoresists, wire insulation, textile coatings, laminates, printing plates, etc.

Cure of the curable composition can be achieved by activating the onium salt to provide the release of the strong acid catalyst. Activation of the onium salt can be achieved by heating the composition at a temperature in the range of from 150° C to 250° C. Preferably, cure can be achieved by exposing the curable composition to radiant energy such as electron beam or ultraviolet light. Electron beam cure can be affected at an accelerator voltage of from about 100 to 1,000 KV. Cure of the compositions is preferably achieved by the use of UV irradiation having a wavelength of from 1849 Å to 4000 Å and an intensity of at least 5,000–80,000 microwatts per $cm^2$. The lamp systems used to generate such radiation can consist of ultraviolet lamps, such as from 1 to 50 discharge lamps, for example, xenon, metallic halide, metallic arc, such as a low, medium or high pressure mercury vapor discharge lamp, etc., having an operating pressure of from a few millimeters to about 10 atmospheres, etc., can be employed. The lamps can include envelopes capable of transmitting light of a wavelength of from about 1849 Å to 4000 Å, and preferably 2400 Å to 4000 Å. The lamp envelope can consist of quartz, such as Spectrocil, or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere.

In order that those skilled in the art will be better able to practice the invention, the following examples are given by way of illustration and not by way of limitation. All parts are by weight.

EXAMPLE 1

A solution of 100 parts of a methylated urea resin, Resime X970 produced by the Monsanto Chemical Company containing a butanol solvent and 2 parts of triphenylsulfonium hexafluoroarsenate was applied onto silicon steel panels to a thickness of 2 mils. Some of the treated steel panels were exposed to a GE H3T7 lamp for 1 minute at a distance of 6 inches, followed by a heat cure for 5 minutes at 150° C. Other treated steel panels were subjected to the UV cure only while other steel panels were subjected only to a heat cure. In addition, some of the treated steel panels were not subjected to either a UV cure or a heat cure. The various treated panels were then tested for acetone resistance by rubbing a cloth saturated with acetone onto the surface of the treated panel. If the organic resin was completely removed as a result of the acetone rubbing process, the organic resin was considered nonresistant to acetone. If the resin remained uneffected as a result of the acetone rubbing process, the resin was considered completely resistant to acetone. The following results were obtained:

| UV Cure | Heat Cure | Acetone Resistance |
|---|---|---|
| None | None | None |
| None | 5 min. at 150° C | None |
| 5 sec. | None | Slightly resistant |
| 5 sec. | 5 min. at 150° C | Completely resistant |

The above results show that acetone resistant organic resin coatings can be made from methylated urea resins after a 5 second cure under ultraviolet light followed by a 5 minute cure at 150° C.

The above procedure was repeated except that in place of the methylated urea resin there was employed Resime X720, a butylated urea resin in 13% water and 7% methanol, Resime X714, a methylated melamine in 20% water and Resime X135, a methylated melamine resin in 20% isopropanol. It was found that substantially the same results were obtained establishing that organic resin coatings were obtained completely resistant to the effects of acetone rubbing when the resins were subjected to a 5 second UV cure, followed by a 5 minute heat cure at 150° C.

EXAMPLE 2

A series of curable resins A, B and C were respectively prepared from 20 parts Resime X720, a butylated urea resin, and 80 parts of a cocoanut oil modified alkyd resin derived from the reaction of phthalic anhydride and a mixture of aliphatic glycols. Resin A was free of a curing catalyst; resin B contained one part of $H_3PO_4$; and resin C contained 2 parts of triphenylsulfonium hexafluoroarsenate. The various curable resins applied onto steel panels to a thickness of about 1.5 mil, and then subjected to either a heat cure, a UV cure, or both. The respective treated panels were then checked for acetone resistance in accordance with Example 1. The following results were obtained where "onium salt" is triphenylsulfonium hexafluoroarsenate:

| Catalyst | UV Cure | Bake | Acetone Resistance |
|---|---|---|---|
| None | None | 45 min at 150° C | None |
| $H_3PO_4$ | None | 45 min at 150° C | None |
| Onium salt | None | 15 min at 150° C | None |
| Onium salt | 5 sec | 5 min at 150° C | Excellent |

The above results show that the curable resin free of catalyst remained uncured even after 45 minutes at 150° C. The above results also show that the curable organic resin readily cured when an onium salt was employed as the curing catalyst in combination with a UV cure followed by a bake in accordance with the practice of the present invention. However, when the resin was free of the onium salt, an incomplete cure was effected, based on the failure of the coating to resist the effects of the acetone rubbing.

EXAMPLE 3

Several steel panels D, E and F were treated respectively with GE Methylon Resin 75108, a phenol-formaldehyde resin having 80% solids. In D, the resin was free of a curing catalyst; the resin in E contained 1 part by weight of ethylphosphoric acid, and in F, the resin contained 2 parts by weight of triphenylsulfonium hexafluoroarsenate. The various panels were then subjected to a heat cure, while some of the panels were further subjected to a UV cure. In addition to determining whether the 1.5 mil resin films were acetone resistant, the weight percent of volatiles was also measured as shown by the following results:

| Catalyst | UV Cure | Heat Cure | Acetone Resistance | (WT % Loss) Volatiles |
|---|---|---|---|---|
| None | None | 35 min at 150° C | None | 31% |
|  | None | 50 min at 150° C | None | 42% |
| ethylphosphoric acid | None | 30 min at 150° C | Poor | 31% |
|  | None | 60 min at 150° C | Fair | 35% |
| Onium salt | None | 30 min at 150° C | None | 37% |
|  | 15 sec. | 15 min at 150° C | Excellent | 20% |
|  | 30 sec. | 30 min at 150° C | Excellent | 19% |

The above results establish that effective acetone resistance and minimum weight loss of volatiles result with the UV curable compositions of the present invention. One skilled in the art also would know that volatiles lost from the cured film made in accordance with the practice of the present invention were actually the loss of the solvent used in the original organic resin. However, the weight percent of volatiles lost in the resin of the prior art included uncured organic resin in addition to solvent was also lost.

The above procedure was repeated except that a higher molecular weight phenol formaldehyde resin, GE Methylon 7512, was used. It was found that with respect to acetone resistance, substantially the same results were obtained. In other words, only the phenol formaldehyde resin containing the onium salt of the present invention exhibited excellent acetone resistance after a 15 second irradiation and a 15 minute bake at 150° C.

EXAMPLE 4

The efficiency of various onium salt photoinitiators were determined in a phenol formaldehyde resin, GE Methylon 7518, utilizing initiators at 2% by weight. The various phenol formaldehyde compositions were applied onto steel panels and thereafter cured under UV light as previously described, for a period of from 0 to 30 seconds, followed by baking a 150° C for 15 minutes. Efficiency of cure was based on whether the film was tacky. The following results were obtained:

| Triphenyl Sulfonium Salt | 0 sec UV | 5 Sec UV | 15 Sec UV | 30 Sec UV |
|---|---|---|---|---|
| None | None | None | None | None |
| $AsF_6$ | " | Good | Excellent | Excellent |
| $SbF_6$ | " | Excellent | Excellent | Excellent |
| $PF_6$ | " | Fair | Fair | Fair |
| $BF_4$ | " | None | None | Fair |

The above results show that the most effective photoinitiator is a hexafluoroantimonate.

EXAMPLE 5

A study was made to determine the change in viscosity in the dark of a butylated melamine resin, Resime X720, containing various curing catalysts over a period of from 0 to 1700 hours under ambient conditions. There were utilized, respectively, 1% by weight of $H_3PO_4$, 1% by weight of p-toluene sulfonic acid, and 2% by weight of triphenylsulfonium hexafluoroarsenate. The following results were obtained, where the change in viscosity is expressed in centipoises:

| Catalyst | 0 | 186 | 380 | 1700 (hours) |
|---|---|---|---|---|
| None | 200 | 200 | 200 | 225 |
| $H_3PO_4$ | 165 | Gelled |  |  |
| p-Toluene Sulfonic Acid | 125 | 1600 | Gelled |  |
| Onium Salt | 85 | 85 | 92 | 110 |

The above results show that the melamine resin containing the onium salt had superior shelf stability over a period of 1700 hours at room temperature as compared to the shelf stability of the melamine resin containing prior art catalylsts.

The above procedure was repeated, except that the respective curable melamine resin compositions were stored at 50° C. It was found that the onium salt melamine resin composition experienced a change, over a period of 300 hours, of from 85 centipoises to 600 centipoises. However, the melamine resin containing the $H_3PO_4$ gelled after 155 hours, while the melamine resin containing p-toluene sulfonic acid gelled after 67 hours.

EXAMPLE 6

Following the procedure of Example 5, a shelf stability determination was made with phenolformaldehyde resin GE Methylon 75108 over an extended period at 50° C, employing 1% by weight of $H_3PO_4$ and 2% by weight triphenylsulfonium hexafluoroarsenate. The following results were obtained: (Viscosity in centipoises)

| Catalyst | 0 | 150 | 2500 | 3200 (hours) |
|---|---|---|---|---|
| $H_3PO_4$ | 880 | 54 | 5000 | gelled |
| Onium Salt | 600 | 430 | 630 | 3500 |

The above results show that the triphenylsulfonium hexafluoroarsenate onium salt provides phenolformaldehyde resins which have superior shelf life at 50° C over an extended period of time as compared to phenolic resins containing prior art curing catalysts.

EXAMPLE 7

The phenolformaldehyde resin composition of Example 6 was applied onto steel panels at thicknesses of from 1 mil, 3 mil and 5 mil, followed by a UV cure and a 150° C bake to determine the degree of cure as measured by ability to resist the acetone wipe test. The following results were obtained:

| Coating Thickness | UV Cure | 150° C Bake | Acetone Resistance |
|---|---|---|---|
| 1 mil | None | 15 min | None |
|  | 15 sec | 15 min | Excellent |
| 2-3 mil | None | 15 min | None |
|  | 15 sec | 15 min | Excellent |
| 5 mil | None | 15 min | None |
|  | 15 sec | 15 min | Fair |
|  | 30 sec | 15 min | Excellent |

The above results establish that the UV curable organic resin compositions of the present invention can be satisfactorily cured up to thicknesses of up to 5 mil.

Although the above examples are directed to only a few of the very many UV curable organic resin compositions of the present invention, it should be understood that the present invention is direction to a much broader variety of UV curable resin compositions as shown in the description preceding these examples. In addition, the above examples show only a few of the very many variables which can be employed in the method of the present invention directed to treating various substrates with the aforementioned UV curable resin compositions, followed by the UV cure of such compositions, and the baking of the resulting UV cured compositions.

What I claim as new and desire to secure by Letters Patent of the United States is:

1. UV curable organic resin compositions consisting essentially of
   (1) a thermosetting organic condensation resin of formaldehyde and a member selected from the class consisting of urea, phenol and melamine,
   (2) an effective amount of a Group VIa onium salt of the formula,

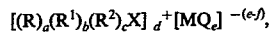

and
   (3) from 0 to 5 parts of filler per part of said thermosetting organic condensation resin, where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, $a$ is a whole number equal to 0 to 3 inclusive, $b$ is a whole number equal to 0 to 2 inclusive, $c$ is a whole number equal to 0 or 1, where the sum of $a + b + c$ is a value equal to 3 or the valence of X, $d = e\text{-}f$ $f =$ valence of M and is an integer equal to from 2 to 7 inclusive $e$ is $> f$ and is an integer having a value up to 8.

2. A curable composition in accordance with claim 1, where the composition contains as a thermosetting organic resin, a urea-formaldehyde resin.

3. A curable organic composition in accordance with claim 1, where the thermosetting organic condensation resin is a phenol-formaldehyde resin.

4. A curable composition in accordance with claim 1, where the thermosetting organic condensation resin is a melamine-formaldehyde resin.

5. A curable resin composition in accordance to claim 1 where the Group VIa onium salt is present at from 0.1% to 15% by weight.

6. A curable resin composition in accordance with claim 1, where the Group VIa onium salt is a sulfonium salt, 7. A curable resin composition in accordance with claim 1, where the Group VIa onium salt is a triphenylsulfonium salt.

* * * * *